United States Patent
Atwater et al.

(10) Patent No.: US 7,301,172 B2
(45) Date of Patent: Nov. 27, 2007

(54) SEQUENTIALLY CHARGED NANOCRYSTAL LIGHT EMITTING DEVICE

(75) Inventors: Harry A. Atwater, South Pasadena, CA (US); Robert J. Walters, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 164 days.

(21) Appl. No.: 11/100,807

(22) Filed: Apr. 6, 2005

(65) Prior Publication Data

US 2005/0247924 A1 Nov. 10, 2005

Related U.S. Application Data

(60) Provisional application No. 60/560,167, filed on Apr. 7, 2004.

(51) Int. Cl.
*H01L 27/15* (2006.01)
(52) U.S. Cl. .................. 257/79; 257/E33.001; 977/950
(58) Field of Classification Search ............ 257/79; 977/950
See application file for complete search history.

(56) References Cited

U.S. PATENT DOCUMENTS

| | | | |
|---|---|---|---|
| 5,179,316 A * | 1/1993 | Kellam | 313/499 |
| 5,714,766 A | 2/1998 | Chen et al. | |
| 6,060,743 A | 5/2000 | Sugiyama et al. | |
| 6,407,424 B2 | 6/2002 | Forbes | |
| 6,586,785 B2 | 7/2003 | Flagan et al. | |
| 6,723,606 B2 | 4/2004 | Flagan et al. | |
| 2003/0034486 A1 | 2/2003 | Korgel | |
| 2003/0230629 A1* | 12/2003 | Bourianoff et al. | 235/454 |
| 2004/0031975 A1 | 2/2004 | Kern et al. | |
| 2005/0253136 A1* | 11/2005 | Ono et al. | 257/40 |

OTHER PUBLICATIONS

Wang et al. "Greem ZnO Phosphor by Oxidation of Metallic Zinc in Air," Abstract Twelfth Inernational Symosium on the Physics and Chemistry of Materials, May 2, 2003.*
International Search Report for International Application No. PCT/US2005/011640, filed Apr. 6, 2005, report completed Sep. 1, 2006, mailed Oct. 17, 2006, 2 pgs.
Written Opinion for International Application No. PCT/US2005/011640, filed Apr. 6, 2005. report completed Sep. 1, 2006, mailed Oct. 17, 2006, 3 pgs.
Krieger et al., "The Travels of An Exciton", Focus, Phys. Rev. Lett. 91, 177401, 2 pgs, found at http://focus.aps.org/story/v12/st15, printed Mar. 17, 2005.

(Continued)

*Primary Examiner*—B. William Baumeister
*Assistant Examiner*—Matthew L. Reames
(74) *Attorney, Agent, or Firm*—Christie, Parker & Hale, LLP.

(57) ABSTRACT

A light emitting device including a transistor structure formed on a semiconductor substrate. The transistor structure having a source region, a drain region, a channel region between the source and drain regions, and a gate oxide on the channel region. The light emitting device including a plurality of nanocrystals embedded in the gate oxide, and a gate contact made of semitransparent or transparent material formed on the gate oxide. The nanocrystals are adapted to be first charged with first type charge carriers, and then provided second type charge carriers, such that the first and second type charge carriers form excitons used to emit light.

34 Claims, 5 Drawing Sheets

OTHER PUBLICATIONS

Walters et al., "Field-Effect Electroluminescence In Silicon Nanocrystals", Nature Materials, Advance Online Publication, www.nature.com/naturematerials, Jan. 23, 2005, pp. 1-4.

Linnros, Jan, "Optoelectronics—Nanocrystals Brighten Transistors", Nature Materials, www.nature.com/naturematerials, vol. 4, Feb. 2005, pp. 117-119.

"Quantum Dots", found at http://vortex.tn.tudelft.nl/grkouwen/qdotsite.html, printed Mar. 29, 2005, 3 pgs.

"Fundamentals", Chapters 2; pp. 7-20.

"Phonon", found at http://en.wikipedia.org./wiki/Phonon, printed Mar. 17, 2005, 7 pgs.

"Exciton", found at http://en.wikipedia.ort/wiki/Exciton, printed Mar. 17, 2005, 1 pg.

\* cited by examiner

SEQUENTIALLY CHARGED NANOCRYSTAL LIGHT EMITTING DEVICE

CROSS REFERENCE TO RELATED APPLICATIONS

This application claims priority to and the benefit of U.S. Provisional Patent Application No. 60/560,167 entitled "Sequentially Charged Nanocrystal Light Emitting Device" filed Apr. 7, 2004, the entire content of which has been incorporated herein by reference.

STATEMENT REGARDING FEDERALLY SPONSORED RESEARCH OR DEVELOPMENT

The U.S. Government has certain rights in this invention pursuant to MURI Grant No. AFOSR #FA9550-04-1-0434 awarded by the Air Force Office of Scientific Research.

FIELD OF THE INVENTION

This application relates to light emitting devices, and more particularly to light emitting devices comprising nanocrystals.

BACKGROUND

In conventional light emitting diodes (LEDs), a direct current is applied through the device to create excitons in its active region, which in turn are emitted as light. However, when the direct current is applied to the bulk semiconductor material of the LEDs, many of the charge carriers that make up the applied current do not form excitons in the active region of the device. Hence, much of the applied energy is wasted.

Because of the availability and maturity of silicon microelectronics technologies, it would be beneficial to use silicon for the fabrication of optoelectronic devices. Light emission in conventional bulk silicon-based devices, however, is constrained in wavelength to infrared emission, and is inefficient because of the indirect band gap of silicon. Due to its poor light emitting properties, silicon is typically not used to fabricate light emitting devices.

Therefore, it is desirable to provide a silicon or other semiconductor based light emitting device which is very efficient, such that only minimal energy is wasted in constructing the electron-hole pairs that generate the necessary excitons.

SUMMARY

In an exemplary embodiment of the present invention, a light emitting device including a transistor structure formed on a semiconductor substrate is provided. The transistor structure has a source region, a drain region, a channel region between the source and drain regions, and a gate oxide on the channel region. The light emitting device includes a plurality of nanocrystals embedded in the gate oxide, and a gate contact made of semitransparent or transparent material formed on the gate oxide. The nanocrystals are adapted to be charged with first type charge carriers, and then provided second type charge carriers, such that the first and second type charge carriers form excitons which can then be used to emit light.

In another exemplary embodiment according to the present invention, a method of emitting light from a light emitting device is provided. In such an embodiment, the light emitting device includes a transistor structure formed on a semiconductor substrate and having a source region, a drain region, a channel region between the source and drain regions, a gate oxide on the channel region, and a plurality of nanocrystals embedded in the gate oxide. The method includes injecting first type charge carriers into the nanocrystals; and after injecting the first type charge carriers, injecting second type charge carriers into the nanocrystals, such that the first and second type charge carriers form excitons that can be used to emit light.

In yet another exemplary embodiment according to the present invention, a light emitting device is provided. The light emitting device includes a gate oxide formed on a semiconductor substrate, a floating gate array of nanocrystals embedded in the gate oxide, and a transparent or semi-transparent gate contact formed on the gate oxide. The nanocrystals are adapted to be first charged with first type charge carriers, and then provided second type charge carriers, such that the first and second type charge carriers form excitons that can be used to emit light.

BRIEF DESCRIPTION OF THE DRAWINGS

These and other aspects of the invention will be more readily comprehended in view of the discussion herein and accompanying drawings.

DETAILED DESCRIPTION

In exemplary embodiments according to the present invention, a new type of light emitting device based on the unique luminescence properties of nanocrystals or quantum dots, is provided. When silicon is grown in the form of tiny nanocrystals or quantum dots, the light emitting properties of silicon improve as a consequence of confinement effects, which shield charge carriers (i.e., carriers) from defects and enhance light emission. However, because of potential barriers that form on their periphery, finding an efficient method for injecting electrons and holes into nanocrystals, which is necessary to stimulate the emission of light, has been difficult. In addition, the nanocrystals or quantum dots must be electrically isolated from their environment, otherwise, the confinement potential that gives them their unique properties is not provided.

In the past, nanocrystal based light emitting devices were generally based on conventional device geometries and conventional designs similar to that of a p-n diode LED, such as, for example, P-N junction LEDs fabricated using silicon or gallium arsenide (GaAs). As such, conventional light emitting devices based on semiconductor nanocrystals have a design similar to that used for a bulk material light emitting device.

In exemplary embodiments of the present invention, a novel scheme for the charge injection is provided. Instead of having a diode structure where the nanocrystals are in the middle of the junction, which would then be driven by DC current, the light emitting device according to exemplary embodiments of the present invention has a structure similar to a field effect transistor, e.g., a metal-oxide-semiconductor field-effect transistor (MOSFET). Hence, the light emitting device can be said to have a transistor structure.

In more detail, the fabrication of the light emitting device is based on a conventional floating gate memory technology. In such a fabrication method, the nanocrystals are embedded in the gate oxide to form a floating gate. The charge carriers are then injected into the nanocrystals sequentially (e.g., holes first then electrons, or vice versa) from the channel of the device using an alternating current (AC) electric excitation. In other words, electrons and holes tunnel sequentially from the channel under the influence of an alternating voltage applied to the gate of the transistor structure of the light emitting device. In this manner, the nanocrystals are charged in an AC-like manner such that photons are generated in bursts.

Because very little energy is wasted in constructing the electron-hole pairs the light emitting device of the present invention is extremely efficient. This can be contrasted with conventional LEDs, in which many of the charge carriers that make up the applied current do not form excitons in the active region of the device.

As previously discussed, during operation of the light emitting device of the present invention, initially first type charge carriers are charged to the nanocrystals, and then second type charge carriers are provided to the nanocrystals such that they together form excitons. The first and second type charge carriers may be negative and positive charge carriers (i.e., electrons and holes), respectively, or vice versa. This was an unexpected result because those skilled in the art would have expected this scheme to simply pull in charge carriers of one type and then immediately inject charge carriers of the other type without a significant formation of excitons through their interaction.

Another advantage of an LED formed in accordance with the present invention is that the nanocrystals shield the charge carriers (i.e., holes and electrons) from defects that are present in bulk crystalline materials. These crystallographic defects are known to limit the achievable internal quantum efficiency in devices constructed from bulk materials. Another advantage of the confinement is that the charge carriers do not diffuse over a long distance, such that higher carrier concentration levels can be formed before Auger recombination (which does not result in emission of light) becomes dominant. As such, radiative recombination becomes virtually the only process by which electrons and holes recombine. In other words, in exemplary embodiments of the present invention, the potential barrier formed around each nanocrystal inhibits the diffusion of injected charge carriers, and increases the probability that these charge carriers will recombine to emit light. Hence, in exemplary embodiments of the present invention, the internal quantum efficiency is very high.

As a result of the novel structure and function of the nanocrystal LEDs of current invention, a strong light emission is realized with quantum efficiencies (defined as the ratio of photons emitted to electron-hole pairs generated or injected) approaching 100%. Moreover, this level of efficiency is an average for clusters of silicon nanocrystals at room temperature. Further, the wavelength of light emitted by these nanocrystals can be selectively changed by varying the size of the nanocrystals, from the near infrared through the entire visible spectrum, as known to those skilled in the art.

Figure 1:
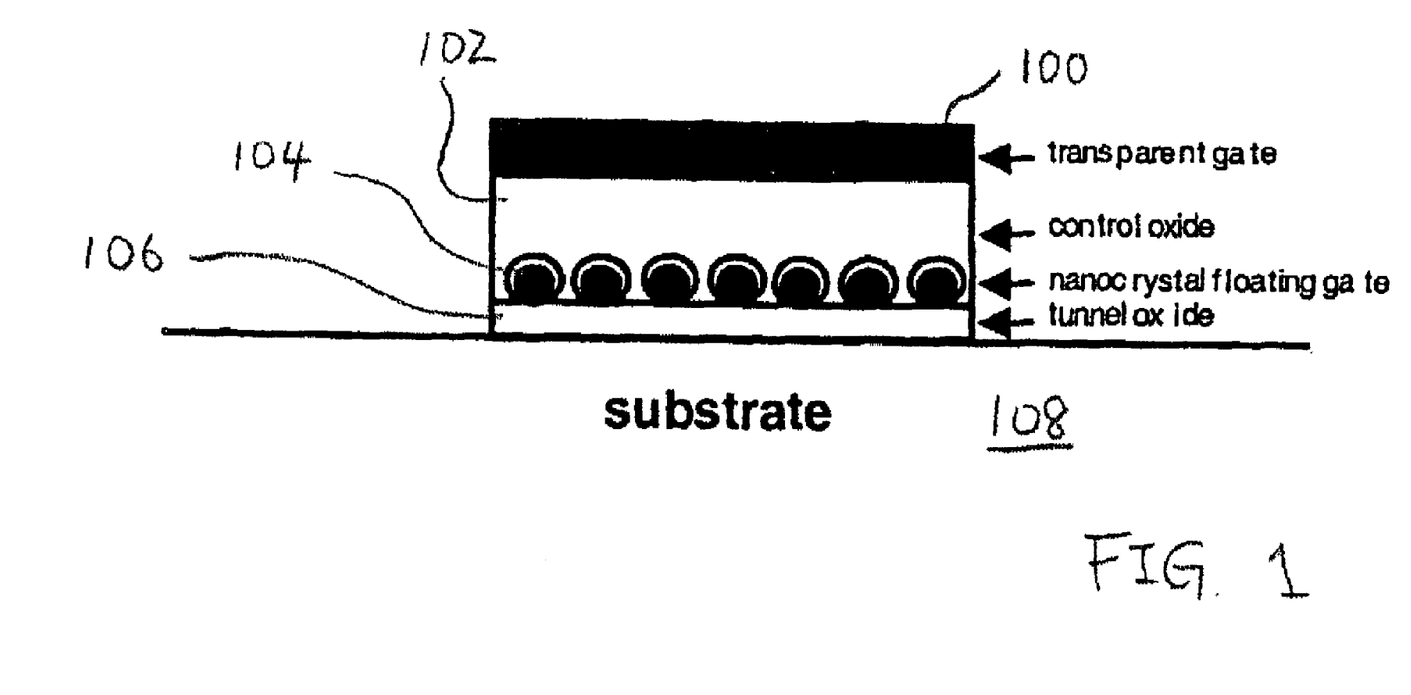
FIG. 1 is a conceptualized schematic view of a transistor structure that can operate as a light emitting device in exemplary embodiments of the present invention.

An exemplary embodiment of a light emitting device in accordance with the current invention is shown schematically in FIG. 1. As depicted, the device includes a gate contact 100, a control oxide 102, a nanocrystal floating gate 104, and a tunnel oxide 106. The light emitting device is formed on a substrate 108. The substrate 108 can be any material suitable for the deposition of the necessary materials, such as, for example, silicon. Further, the control oxide 102 and the tunnel oxide 106 that separates the nanocrystal floating gate from the substrate 108 can also be any suitable materials, such as, for example, silicon dioxide ($SiO_2$).

As can be seen in FIG. 1, the layout of the light emitting device structure in one exemplary embodiment is based on conventional metal insulator semiconductor/metal oxide semiconductor (MIS/MOS) floating gate devices. The floating gate 104 includes an array of semiconductor nanocrystals, and the gate contact 100 is optically semi-transparent or transparent to enable optical access to the semiconductor nanocrystals 104, such that the emitted light can be visible outside of the device. In such an embodiment the nanocrystals may be made of any suitable elemental or compound semiconductor, such as, for example, silicon, gallium arsenide or cadmium selenide. Although MIS/MOS designs are discussed above, in other embodiments, waveguide and/or micro-resonator integrated design geometries may also be used for the inventive light emitting device structure.

In the light emitting device of FIG. 1, charge carriers are sequentially injected into the nanocrystals of the floating gate 104. The charge carriers then form excitons that recombine to emit photons. The light emitting device can be fabricated using a modified CMOS process and allows for power efficient light sources, or in devices that are scaled down to include a single nanocrystal emitter, novel "photon on demand" sources, and local excitation sources for plasmonic circuits. The light emitting device of FIG. 1 utilizes the specific material properties of the semiconductor nanocrystals embedded in the insulating matrix to yield light emission in response to an electrical pump signal. Charge injection of electrons and holes can be accomplished through a variety of transport mechanisms including, but not limited to, direct and Fowler-Nordheim tunneling and hot carrier injection.

The gate contact 100 should be electrically continuous such that a substantially uniform bias can be created above the channel. When the gate bias is programmed negatively with respect to the substrate 108, a single hole tunnels into each nanocrystal in a self-limiting process. Upon return to a zero bias condition, these holes are stored in the nanocrystals of the floating gate 104. The gate bias is then set to a positive value, drawing a single electron into each nanocrystal. Alternatively, the gate bias may switch from a negative to a positive bias, substantially instantaneously.

When an electron encounters the previously stored hole, an exciton is formed. This exciton can then recombine radiatively forming a light emission, or non-radiatively to transfer energy to a secondary emitter such as a rare earth ion or a suitable plasmonic structure. In another alternative non-radiative recombination, excitons prepared in the nanocrystals can be selectively quenched by the application of an additional programming pulse as follows: neutral nanocrystals containing excitons can be programmed with an additional hole or electron, leading to the non-radiative Auger de-excitation of the exciton. In this embodiment, the energy of the exciton is radiated away as phonons in the supporting $SiO_2$ matrix (i.e., gate oxide), and the nanocrystals are left with a single charge that can be reused or ejected into the channel. By modifying the programming sequence the light emitting device may be made to radiate only during a short window of time that can potentially be much less than the natural radiative lifetime. This may allow the light emitting device to be used as a novel "photon on demand" source, especially in devices that are scaled down to include a single nanocrystal. For example, in one embodiment of the invention a single nanocrystal could act as an electrically pumped local "photon on demand" excitation source for plasmonic circuits.

Figure 2A:
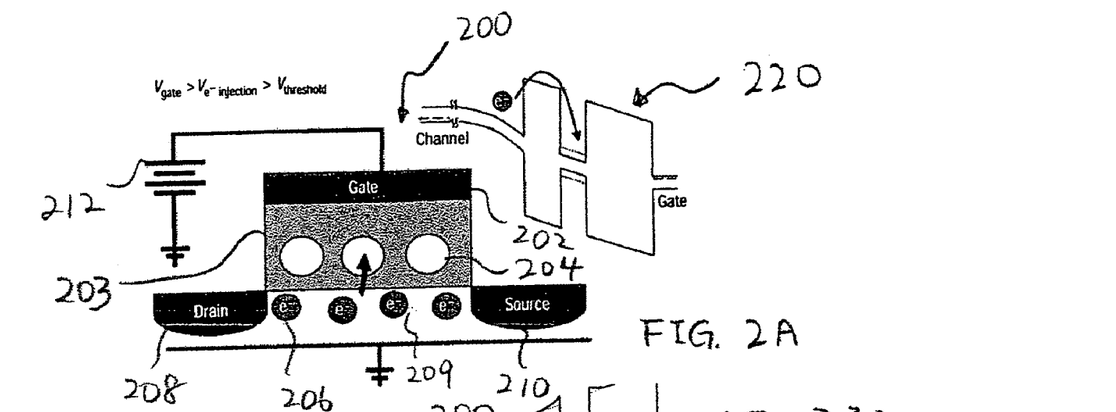
FIG. 2A is a schematic view of a light emitting device according to an exemplary embodiment of the present invention, illustrating a method of charging nanocrystals with electrons through Fowler-Nordheim tunneling.
Figure 2B:
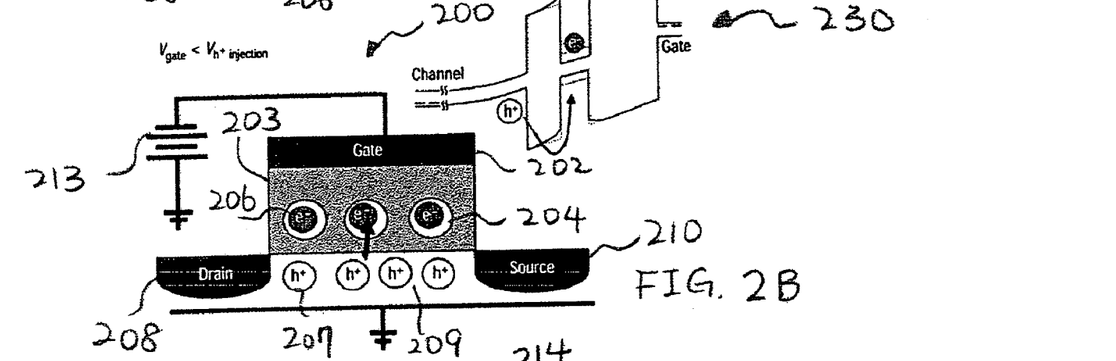
FIG. 2B is a schematic view of the light emitting device according to the exemplary embodiment of the present invention, illustrating a method of providing holes to the negatively charged nanocrystals via Coulomb field-enhanced Fowler-Nordheim tunneling.
Figure 2C:
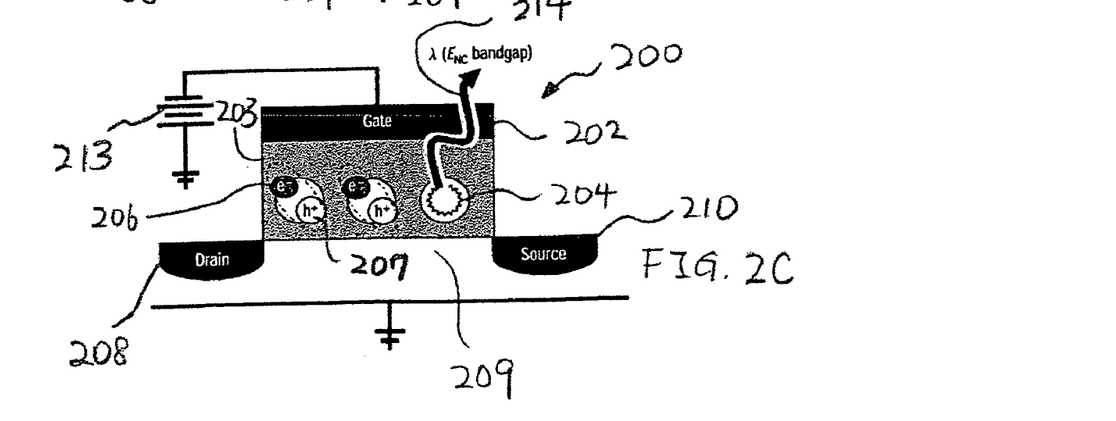
FIG. 2C is a schematic view of the light emitting device according to the exemplary embodiment of the present invention, illustrating the radiative recombination of holes and electrons.

FIGS. 2A to 2C show a schematic representation of the field-effect electroluminescence mechanism of a light emitting device 200. It can be seen in FIGS. 2A to 2C that the array of silicon nanocrystals embedded in the gate oxide of the light emitting device can be sequentially charged with electrons (via Fowler-Nordheim tunneling), and holes (via Coulomb field-enhanced Fowler-Nordheim tunneling) to prepare excitons that radiatively recombine. Band diagrams 220 and 230 of FIGS. 2A and 2B, respectively, depict the relevant tunneling processes for these phenomena. Although the light emitting device 200, has substantially the same structure as the light emitting device of FIG. 1, it should be understood that any of the structures discussed in the current specification may be operated in this manner.

In the light emitting device 200, a floating gate array of silicon nanocrystals 204 is formed from well-passivated silicon nanocrystals small enough to have excitonic emission energies that are higher than the bulk silicon emission energy. The light emitting device 200 of FIGS. 2A-2C has a three-terminal transistor structure in which nanocrystals are embedded in the gate oxide of a conventional MOSFET. These nanocrystals form the floating gate and may also be referred to as a floating gate array of nanocrystals. The gate contact 202 is semi-transparent or transparent at the device emission wavelength and is designed to provide substantially uniform control of the channel potential.

Under appropriate bias conditions, a nanocrystal array as shown in FIGS. 2A-2C may be programmed with electrons or holes. In the specific case of a device fabricated on a p-type substrate, the electrons may be programmed from an inversion layer and the holes programmed from the channel in accumulation. In one embodiment of the invention, electrons and holes are injected sequentially into the nanocrystals in the gate oxide from the channel of the MOSFET by applying an alternating electric field to the gate. The sequential accumulation of electrons and then holes within these nanocrystals on each cycle thereby results in recombination and the emission of light. In this mode of operation, the charge carriers are injected from only one side of the nanocrystal-embedded matrix. The charge carrier tunneling efficiency is substantially governed by the distance between the nanocrystals and the channel, and not by their density or the total matrix thickness. Since the fields necessary to produce light in these three-terminal devices are much lower than for reported two-terminal based nanocrystal devices, oxide degradation due to thermal effects is reduced or minimized, thereby improving the prospects for the long-term operation of the light emitting device.

As can be seen in FIG. 2A, the silicon nanocrystals (represented by circles 204) form the floating gate of a transistor (e.g., MOSFET) 200 with an optical thin conducting gate contact 202. The transistor 200 has a drain 208 and a source 210, and has a substrate which is grounded, for example. The transistor has a channel region 209 between the drain 208 and the source 210. During operation, when the gate bias is programmed positively with respect to the substrate (i.e., $V_{gate} > V_{e\text{-}injection} > V_{threshold}$) using a power source 212, for example, a single electron 206 tunnels into each nanocrystal, as can be seen in FIG. 2A. On the other hand, when the gate bias is programmed negatively with respect to the substrate, a single hole would tunnel into each nanocrystal.

The gate bias is then set to a negative value using a power source 213 with respect to the substrate, as can be seen in FIG. 2B. Then a single hole is drawn into each nanocrystal where it encounters the previously stored electron and forms an exciton, which can then recombine radiatively and emit light 214 as can be seen in FIG. 2C. During operation as the gate bias is first set to a negative value and then positive, the holes would first be stored in the nanocrystals and then electrons would be drawn to the nanocrystals upon application of the positive gate bias thereby forming excitons together with the holes already in the nanocrystals.

Figure 3A:
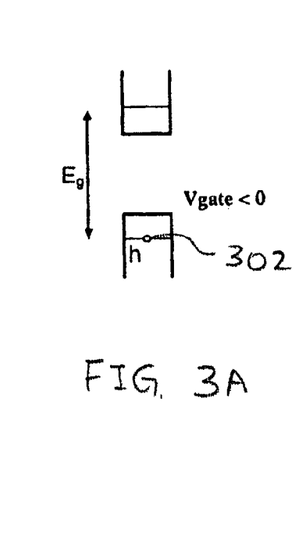
FIGS. 3A-3C illustrate the process of radiative recombination of holes and electrons where the holes are first charged to the nanocrystals.
Figure 3B:
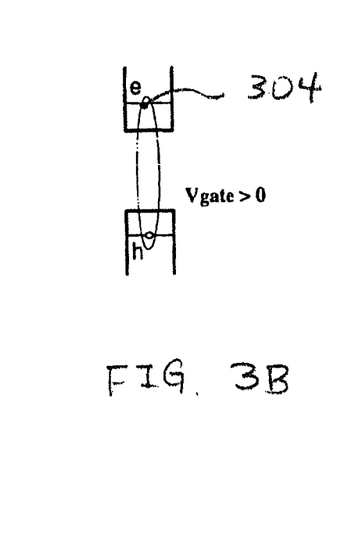
Figure 3C:
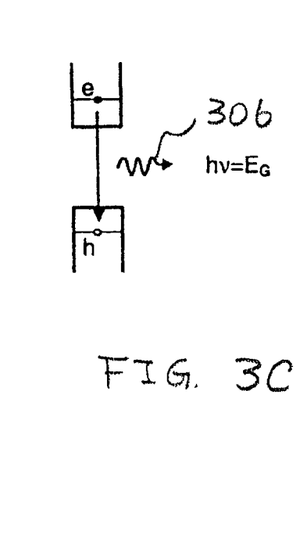
Figure 4A:
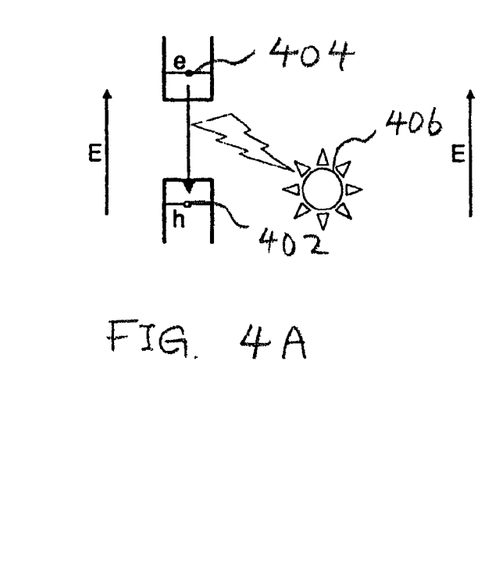
FIGS. 4A and 4B illustrate a non-radiative exciton recombination of holes and electrons via transfer of energy to a secondary emitter, and a subsequent light emission from a secondary emitter.
Figure 4B:
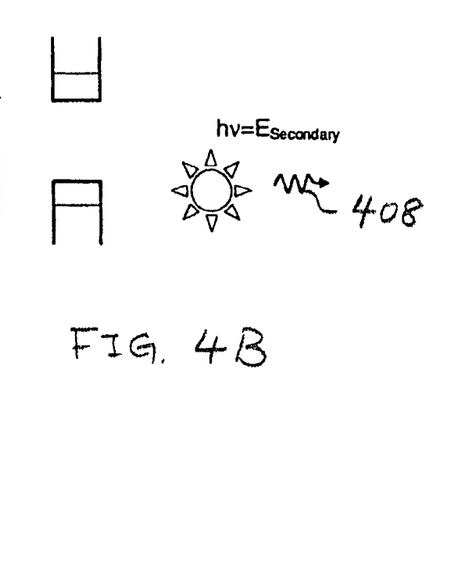

FIGS. 3A to 3C, show a schematic representation of the formation of excitons and their emission as light in an exemplary embodiment of the current invention. For example, these figures respectively show that an initially neutral nanocrystal is charged with a single hole 302 when the gate voltage $V_{gate} < 0$ (FIG. 3A); that the bias is then reversed, i.e., $V_{gate} > 0$ (FIG. 3B), a single electron 304 is introduced to form an exciton; and the exciton then recombines radiatively to emit light 306 (FIG. 3C). On the other hand, FIGS. 4A and 4B show schematic illustrations of a non-radiative energy transferring exciton recombination in accordance with another embodiment of the current invention. As can be seen, a non-radiative emission results from a hole 402 and an electron 404 (FIG. 4A), with near field energy transfer to a secondary emitter 406 (FIG. 4B), and a subsequent light 408 emission from the secondary emitter 406 (FIG. 4C). One of ordinary skill in the art will understand that the secondary emitter can be made of any suitable material, such as, for example, a rare earth ion, a nanocrystal of another material, or an appropriately designed plasmonic structure.

FIGS. 5 to 8 show a variety of test data for exemplary embodiments of the devices in accordance with the current invention.

Figure 5:
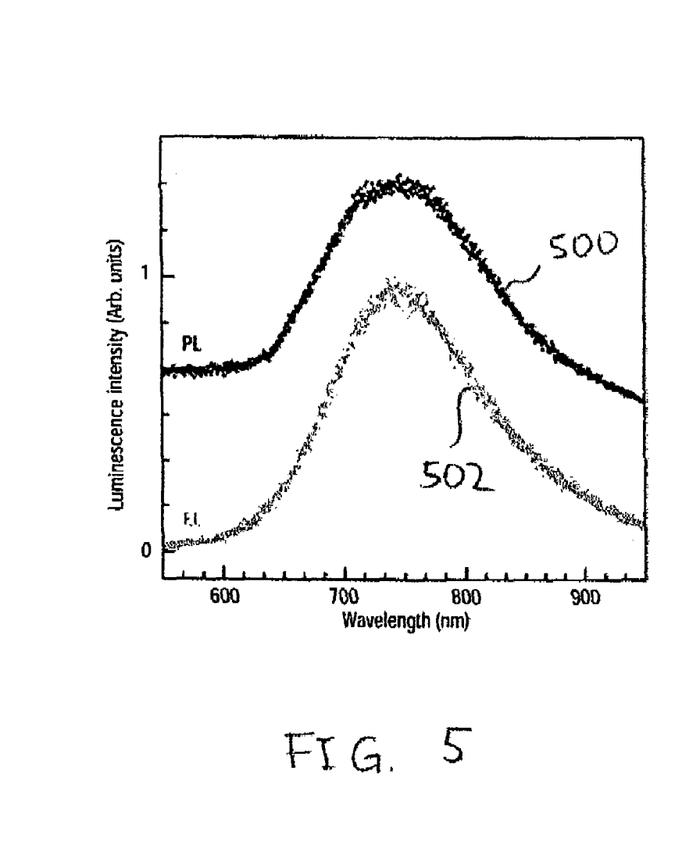
FIG. 5 is a graph representing a comparison between photoluminescence (PL) and electroluminescence (EL) emission spectra measured from the exemplary embodiment of the present invention.

FIG. 5 shows a comparison of nanocrystal photoluminescence (PL) 500 excited through a semi-transparent gate contact to nanocrystal electroluminescence (EL) 502. These spectra can be attributed to the radiative recombination of excitons within silicon nanocrystals. It can be seen in FIG. 5 that both PL and EL spectra peak near 750 nm with a full-width at half-maximum of approximately 160 nm. These emission wavelengths are typical for silicon nanocrystals of approximately 2 to 4 nm in diameter. The spectra are inhomogeneously broadened by the size distribution of silicon nanocrystals in the array.

Figure 6:
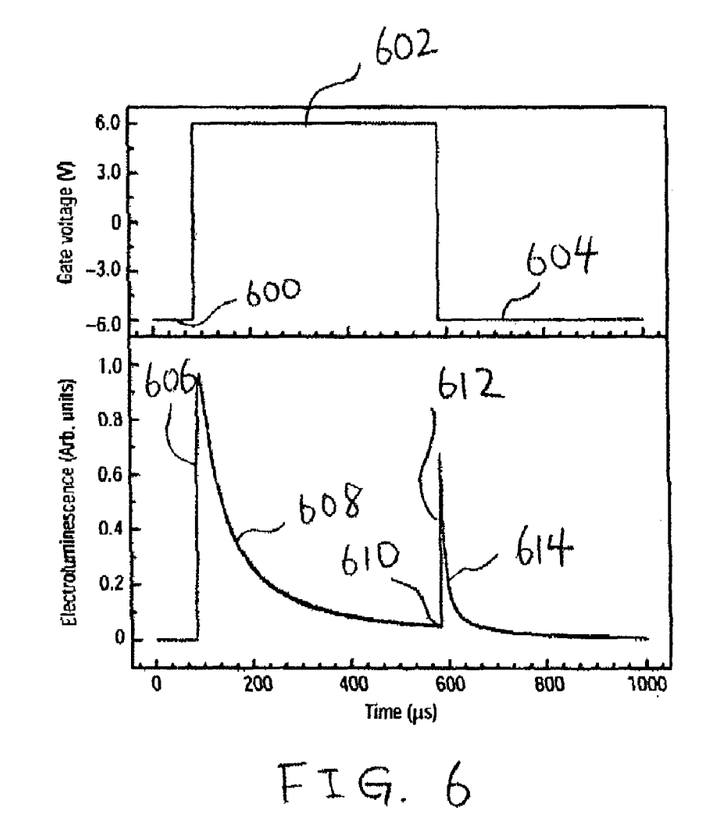
FIG. 6 is a graph that illustrates a relationship between the gate voltage and the electroluminescence for the exemplary embodiment of the present invention.

The electrical excitation process can be understood in more detail by considering a time-resolved electroluminescence trace shown in FIG. 6. When the gate is negatively biased (600) at −6V, the p-type channel is in strong accumulation. During this time, the nanocrystal array is charged with holes by Fowler-Nordheim tunneling across the tunnel oxide as shown in FIG. 2A. The frequency response suggests that this initial charge-injection process occurs on a timescale of approximately 100 microseconds. When the gate is positively biased above threshold (602) at +6V, an electron inversion layer is formed. Electrons are injected into the hole-charged nanocrystals by a Coulomb field-enhanced Fowler-Nordheim tunneling process as shown in FIG. 2B. By this process quantum-confined excitons are formed.

Using Wentzel-Kramer-Brillouin (WKB) approximation-based analysis it has been estimated that a previously injected hole can dramatically enhance the electron tunneling rate of the Fowler-Nordheim rate for electron tunneling into a neutral nanocrystal. The onset of electroluminescence (606) is well fit by a single exponential rise ($\tau$~2.5 microseconds) at the applied +6 V gate bias, suggesting that electron injection is enhanced by a factor of approximately 40 by the presence of holes in the nanocrystal array. The measured electron-tunneling rate enhancement is consistent with Coulomb field-enhanced Fowler-Nordheim tunneling through a tunnel oxide thickness of approximately 4 nm, which is the experimental tunnel oxide thickness targeted in one exemplary fabrication process it should be understood that by reducing the thickness of the tunneling oxide, faster tunneling rate can be achieved. For example, switching speeds of 1 GHz may be realized by the careful selection of the nanocrystal material and the thickness of the tunnel oxide.

Although not to be bound by theory, the observation of electroluminescence implies that holes already confined in the nanocrystals have emission times for tunneling back to the channel that exceed the Coulomb field-enhanced Fowler-Nordheim tunneling time for electron injection from the inversion layer. The observation of electroluminescence also substantially precludes the injection of multiple electrons into the hole-charged nanocrystals as radiative recombination of excitons is evidently not quenched by Auger recombination, which is known to be an efficient non-radiative recombination mechanism in silicon nanocrystals containing an exciton and an addition charge of either polarity.

The emission shown in FIG. 6 decays (608) from its peak value as the previously injected holes are consumed by electrons in exciton formation and decay. A stretched exponential equation with a time constant of approximately 30 microseconds (ideality factor ~0.5) can be used to characterize the observed decay. The time constant is longer than the photoluminescence decay lifetime observed under optical excitation at an applied gate bias of +6V ($\tau$~5 microseconds, ideality factor ~0.7). The longer electroluminescence-decay time constant may reflect an absence of non-radiative recombination paths that are present for some fraction of the excitons recombining under illumination. Also, an indirect charging process involving inter-nanocrystal carrier migration could increase the time for exciton formation.

When electroluminescence is no longer observed (610), there are no more quantum-confined holes left in the array to form excitons. Electrons continue to tunnel into the nanocrystal array due to the positive gate bias, resulting in each nanocrystal becoming recharged with an electron. Multiple charging of nanocrystals is substantially suppressed by Coulombic field-inhibition of Fowler-Nordheim tunneling into charged nanocrystals. The tunneling rate of second electrons may be suppressed by a factor of approximately 300 over the Fowler-Nordheim rate for tunneling of the first electron into a neutral nanocrystal.

These programmed electrons can now form excitons when the gate voltage is switched to a negative potential (604) sufficient (e.g., −6.0V) to enable hole injection from the accumulation layer. This process is characterized by a faster single-exponential rise (612) in electroluminescence ($\tau$~240 nanoseconds) and a faster stretched exponential decay ($\tau$~10 microseconds, ideality factor ~0.5) (614).

As can be seen in FIG. 6, the electroluminescence peak associated with hole injection into electron-charged nanocrystals is smaller in magnitude and shorter in duration than the electroluminescence peak associated with electron injection into hole-charged nanocrystals. This asymmetry may be ascribed to stored electron loss by tunneling back to the channel during hole injection at positive gate bias. This loss mechanism is more apparent for hole injection into electron-charged nanocrystals due to the smaller conduction-band offset (~3.2 eV) than valence-band offset (~4.7 eV) between silicon and silicon oxide.

From a study of the data in FIG. 6 it can be seen that electroluminescence is clearly correlated with injection of the second carrier, indicating that field-effect-induced electroluminescence is due to programmed exciton formation rather than impact excitation resulting from a DC leakage current through the gate stack. The lack of emission under DC electrical bias is further confirmed by an examination of the frequency dependence of electroluminescence in FIG. 7. For a constant two-second measurement integration time electroluminescence is initially observed to increase linearly with increasing driving frequency because light is collected from an increasing number of integrated completed cycles.

Figure 7:
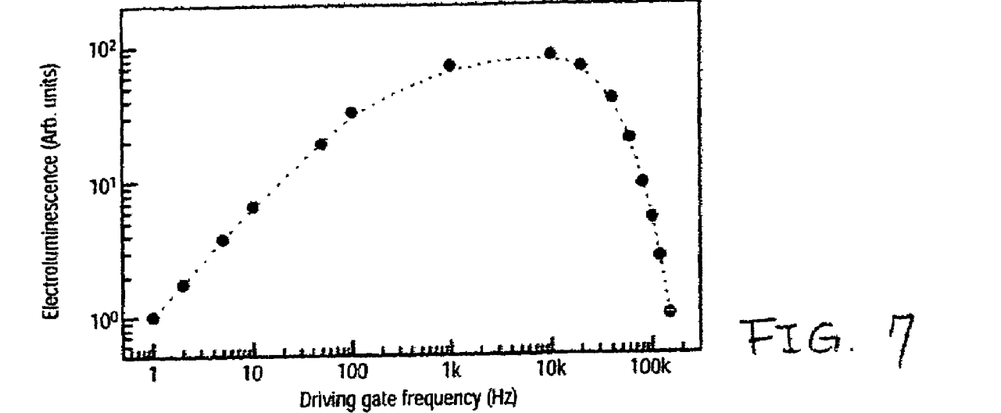
FIGS. 7 and 8, respectively, illustrate a variation of electroluminescence intensity with respect to driving gate frequency and gate voltage for the exemplary embodiment of the present invention.

It can also be seen in FIG. 7 that electroluminescence emission peaks at a frequency of 10 kHz, and then begins to decrease, which can be attributed to several effects. As the driving frequency is increased, the number of excitons formed at positive-to-negative or negative-to-positive bias transitions begins to decrease due to incomplete initial electron (hole) charging. From the 10 kHz peak in the frequency response, the charge injection into neutral nanocrystals may require approximately 100 microseconds. At frequencies above approximately 30 kHz, the pulse duration becomes shorter than the radiative lifetime of silicon nanocrystals and some fraction of the excitons will not recombine. At even higher frequencies, the emission may be further limited by the gate capacitive charging time constant.

Figure 8:
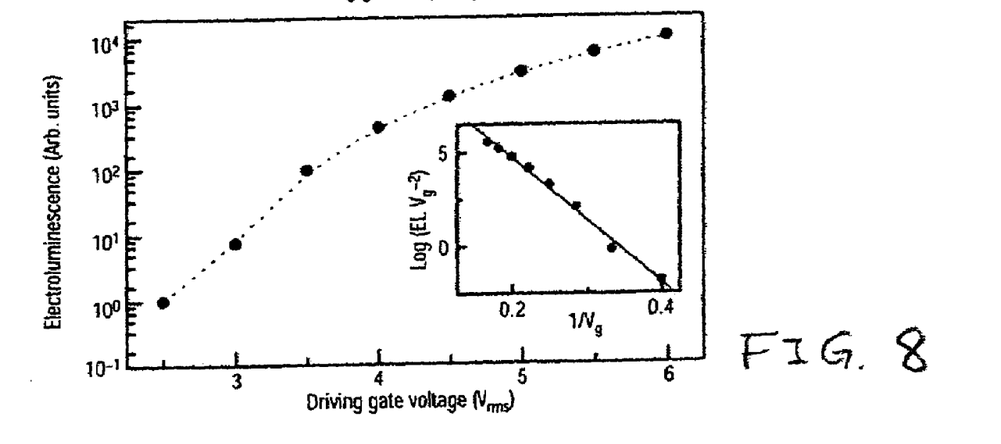

As shown in FIG. 8, electroluminescence increases dramatically with increasing root mean squared (r.m.s.) drive voltage, and has a saturation onset at approximately 4 $V_{rms}$ The tunnel oxide field is proportional to gate voltage and the electroluminescence intensity is proportional to the tunneling current. Thus, an equivalent Fowler-Nordheim plot that is well fit by a linear relation can be constructed. This observation is consistent with initial electron and hole injection into neutral nanocrystals being dominated by a Fowler-Nordheim tunneling process. A distribution of tunneling oxide barrier thickness should be present due to the implantation-based nanocrystal formation process. The slope of the Fowler-Nordheim plot is therefore determined by the average value of the effective field strength, which will vary across the array of nanocrystals.

Although specific silicon devices have been discussed thus far, field-effect electroluminescence is a general carrier-injection method in which electrons and holes are sequentially injected into a nanocrystal array to form excitons. Accordingly, silicon nanocrystals and silicon dioxide tunnel barriers might be replaced by other exciton-confining nanostructures or injection-barrier materials. Devices designed to operate by field-effect electroluminescence may be termed field-effect light-emitting devices (FELEDs) as the principle of operation differs significantly from that of pn-junction LEDs, and the resulting device structures rather resemble field-effect transistors instead.

FELEDs may also be more robust than LED-based nanocrystal light sources because the carrier-injection process can be controlled. In previously reported nanocrystal devices, the optical centers are excited by impact ionization processes in which hot carrier energy creates a nanocrystal-bound exciton. In such a process, excess hot carrier energy is lost to thermalization. Over time, excitation by impact ionization degrades the dielectric quality and can lead to oxide wear-out and device failure. Field-effect-induced carrier injection may enable the problems associate with impact ionization excitation to be circumvented through controlled Fowler-Nordheim tunneling.

During testing of the light emitting device, electroluminescence has been observed at an energy (Eopt) of approximately 1.65 eV, and at driving gate voltages as low as 2.5V. However, it may be appropriate to assume that all nanocrystals in an ideal device can be pumped at this low gate voltage. By requiring continuity of the electric displacement through a gate stack including 8 nm control oxide, 3 nm diameter nanocrystals, and 4 nm tunnel oxide; and neglecting depletion, a potential drop of approximately 0.77 V from the channel to the nanocrystal array can be found. This potential energy drop may be entirely lost to inelastic carrier scattering during Fowler-Nordheim tunneling of the carrier into the nanocrystal.

In order to drive this injection current, the gate capacitance should preferably be charged. A parallel plate model suggests that approximately 0.6 eV is required to cycle the gate above one nanocrystal from 2.5V to −2.5V. A self-capacitance energy cost for charge confinement in a nanocrystal of approximately 0.12 eV self-capacitance energy cost may be further included. In this case, the nanocrystal is modeled as a 3 nm diameter sphere in a silicon dioxide matrix. If other sources of loss are neglected, an energy (Eel) of approximately 3 eV may be required to program one exciton, in contrast to approximately 1.1 eV required for exciton formation in an ideal silicon LED.

It should be noted for the silicon FELED that the internal quantum efficiency of a well-passivated silicon nanocrystal can be very high. If non-radiative excitonic recombination could be completely suppressed in the nanocrystals, the silicon FELED could conceivably have an internal power efficiency (ipe) as high as (ipe=Eopt/Eel) approximately 55%. For an ideal $SiO_2$ matrix silicon FELED fabricated on an optically absorbing substrate, external power efficiency (epe) is bounded to approximately 10%, based on consideration of the oxide index of refraction (n=1.46). By integrating an appropriate back reflector into a FELED device fabricated with a thin (e.g., silicon-on-insulator) substrate, the ideal case external power efficiency could approach 20%.

The light emitting device according to exemplary embodiments of the present invention can be readily fabricated using a standard CMOS compatible process, for example. The structure can therefore be integrated as a light source in conventional silicon based integrated circuits. The floating gate in the semiconductor nanocrystal light emitting devices can also be formed using the following methods. Each of the following methods are known to those skilled in the art. Further, any other suitable methods can be used to form the nanocrystals.

First, the nanocrystals can be synthesized through implantation and annealing where a low energy silicon ion is implanted into the gate oxide, followed by annealing to nucleate and grow silicon nanocrystals. The depth at which silicon nanocrystals form can be changed by varying the implantation energy. The implantation depth effectively determines the gate oxide thickness. The silicon nanocrystal size and density can be modified by varying the post-implantation annealing conditions or by changing the silicon implantation dose. Due to the stochastic nature of the implantation process as well as the nucleation and growth process, the silicon nanocrystals may show some size dispersion.

The nanocrystals may also be formed using aerosol fabrication, self-assembly fabrication, or conventional chemical vapor deposition (CVD) techniques. In aerosol fabrication, size-selected silicon nanocrystals formed by an aerosol method are deposited. This technique potentially offers superior size selection and nanocrystal passivation options. In the self-assembly fabrication, some material systems allow for self-assembly of nanocrystals in solution (solid, liquid, or gaseous). Such techniques present another possible fabrication pathway.

In a nanocrystal or a quantum dot, the color of the light emission is determined by the band gap of the material, and in a bulk material the band gap is a fundamental property of the material. When the material is made very small, such as a nanocrystal or a quantum dot, the band gap energy is increased due to quantum mechanical effects. In other words, size-dependent band gap is achieved. Hence, it is possible to, within certain material constrains, change the band gap simply by changing the size of the nanocrystals. By way of example, when the nanocrystals have a diameter of 2.5 nanometers or less, light emission closer to the red or even down to yellow may be achieved. Accordingly, by controlling the size of the nanocrystals, light emitting devices having red, green and blue colors may be fabricated, which can be used in a full color display device.

In addition a number of semiconductor materials may be used including other semiconductor materials, such as, for example, cadmium selenide (CdSe) nanocrystals can be used. There are a number of vendors who supply CdSe nanocrystals in colors throughout the visible range of the spectrum.

The transparent gate contact for optoelectronic geometries should be conductive and have a sufficient charge density to apply a well-defined field across the silicon nanocrystal doped layer. Some possible gate materials for the gate contact are listed below. Of course, it should be understood that any other suitable material can be used as well to form the transparent gate contact.

First, thin film polycrystalline silicon can be used. Because of the significant optical absorption of silicon at wavelengths shorter than 1.1 microns, the thickness of the polysilicon gate contact should be sufficiently thin to allow transmission of the emitted wavelength. Alternatively indium tin oxide (ITO) may be used as this material is a transparent conductor commonly used in photocell applications.

Alternatively, thin metal films can be used. As in the case of polysilicon, the thickness must be optimized for sufficient transmission. In such an embodiment, free carrier absorption may be significant. Film stability may necessitate the development of appropriate wetting layers for particular barrier materials systems. Further, patterned contacts may be used. By way of example, a transparent or partially transparent gate could be formed by fabricating a patterned gate contact in which a significant fraction of the gate area is open, i.e., not covered by the gate contact material. This design should be optimized to allow for efficient charge injection.

While the extensive understanding of silicon nanocrystals in $SiO_2$/Si MOS structures make this type of device an obvious choice for a model system, the relatively long (typically microseconds) radiative excitonic recombination lifetimes in silicon may limit the luminosity of a silicon based device. By way of example, as a light source, perhaps hundreds of lumens per square centimeter of device area may be provided by the light emitting device of the present invention. For example, assuming $10^{13}$ nanocrystals per $cm^2$ of nanocrystal density, 20% external quantum efficiency, 2 eV (red) photons and a device cycle rate of 1 MHz, 435 lumens/$cm^2$ may be realized from 3.2 Watts of optical power (considering 680 lumens/Watt) in an ideal case.

Direct band gap semiconductor nanocrystal arrays may provide greater luminosity due to a shorter excitonic radiative decay lifetime. The use of nanocrystals with a band gap less than 1.1 eV (such as lead selenide nanocrystals) can be optically accessed through silicon, which is transparent at these energies, allowing for integration of infrared light sources with silicon optical waveguides. Such materials systems also offer the promise of integration with telecommunications systems operating in the infrared.

While certain exemplary embodiments have been described above in detail and shown in the accompanying drawings, it is to be understood that such embodiments are merely illustrative of and not restrictive of the broad invention. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims, and equivalents thereof.

What is claimed is:

1. A light emitting device including a transistor structure disposed on a semiconductor substrate, the transistor structure having a source region, a drain region, a channel region between the source and drain regions, and a gate oxide on the channel region, the light emitting device comprising:
   at least one nanocrystal embedded in the gate oxide;
   a gate contact made of semitransparent or transparent material, and formed on the gate oxide; and
   at least one charge injection source applied between the gate oxide and the semiconductor substrate and programmed such that the at least one nanocrystal is initially injected with at least one first type charge carrier followed by at least one second type charge carrier to form excitons used to produce a light emission.

2. The light emitting device of claim 1, wherein a color of the emitted light is varied by varying the size of the nanocrystal.

3. The light emitting device of claim 1, wherein a single nanocrystal is embedded in the gate oxide.

4. The light emitting device of claim 1, wherein a plurality of nanocrystals are embedded in the gate oxide.

5. The light emitting device of claim 1, wherein the at least one nanocrystal comprises an array of nanocrystals.

6. The light emitting device of claim 5, wherein the array of nanocrystals form a floating gate of nanocrystals.

7. The light emitting device of claim 1, wherein one of the first type charge carriers is injected into the at least one nanocrystal, and one of the second type charge carriers is injected into the at least one nanocrystal.

8. The light emitting device of claim 1, wherein the excitons recombine to emit light.

9. The light emitting device of claim 1, wherein a de-excitation of the excitons results in the energy of the excitons being transferred to excite a secondary emitter of light.

10. The light emitting device of claim 9, wherein the energy transfer is accomplished through a non-radiative de-excitation process selected from the group consisting of near field energy transfer, resonant energy transfer, or carrier transfer.

11. The light emitting device of claim 9, wherein the secondary emitter of light is selected from the group consisting of an elemental or compound semiconductor nanocrystal, a molecular light emitter, or a metallic plasmonic structure.

12. The light emitting device of claim 11, wherein the semiconductor nanocrystal is made of a material selected from the group consisting of gallium arsenide, lead selenide, or cadmium selenide.

13. The light emitting device of claim 1, wherein the first type charge carriers are electrons and the second type charge carriers are holes.

14. The light emitting device of claim 10, wherein the non-radiative de-excitation of the excitons is deliberately encouraged to suppress the emission of light.

15. The light emitting device of claim 9, wherein the first type charge carriers are holes and the second type charge carriers are electrons.

16. The light emitting device of claim 1, wherein the bias source sequentially injects the first and second type charge carriers into the nanocrystals through the channel region of the transistor structure.

17. The light emitting device of claim 1, wherein the first type charge carriers are provided to the nanocrystals when a first bias is applied between the gate oxide and the semiconductor substrate, and the second type charge carriers are provided to the nanocrystals when a second bias is applied between the gate oxide and the semiconductor substrate.

18. The light emitting device of claim 17 wherein the first and second biases have inverse polarities of each other.

19. The light emitting device of claim 1, wherein the nanocrystals are made of one of either an elemental or compound semiconductor.

20. The light emitting device of claim 1, wherein the nanocrystals are made of a material selected from the group consisting of silicon, gallium arsenide, lead selenide, or cadmium selenide.

21. The light emitting device of claim 1, wherein the gate contact comprises a material selected from the group consisting of thin film polycrystalline silicon, indium tin oxide (ITO), a thin metal film, or a patterned contact.

22. The light emitting device of claim 1, wherein the transistor structure is fabricated using a CMOS compatible process.

23. The light emitting device of claim 1, wherein the transistor structure has a structure of a metal-oxide-semiconductor field-effect transistor (MOSFET).

24. The light emitting device of claim 1, wherein the first and second type charge carriers are injected into the nanocrystals by tunneling through a portion of the gate oxide between the channel region and the nanocrystals.

25. The light emitting device of claim 24, wherein the first type charge carriers are injected by Fowler-Nordheim tunneling, and the second type charge carriers are injected via Coulomb field-enhanced Fowler-Nordheim tunneling.

26. A method of emitting light from a light emitting device including a transistor structure formed on a semiconductor substrate and having a source region, a drain region, a channel region between the source and drain regions, a gate oxide on the channel region, and a plurality of nanocrystals embedded in the gate oxide, the method comprising:

injecting first type charge carriers into the nanocrystals; and after injecting the first type charge carriers, injecting second type charge carriers into the nanocrystals, such that the first and second type charge carriers form excitons used to emit the light.

27. The method of claim 26, wherein injecting first type charge carriers comprises injecting one of the first type charge carriers into each of the nanocrystals, and injecting second type charge carriers comprises injecting one of the second type charge carriers into each of the nanocrystals.

28. The method of claim 26, wherein a de-excitation of the excitons results in the transfer of the energy of the excitons to a secondary emitter of light.

29. The method of claim 26, wherein the energy transfer is accomplished by a non-radiative de-excitation process selected from the group consisting of near field energy transfer, resonant energy transfer, or carrier transfer.

30. The method of claim 29, wherein the non-radiative de-excitation is deliberately encouraged to suppress the emission of light.

31. The method of claim 26, wherein the first and second type charge carriers are sequentially injected into the nanocrystals through the channel region of the transistor structure.

32. The method of claim 26, wherein injecting first type charge carriers comprises applying a first bias between the gate oxide and the semiconductor substrate, and wherein injecting the second type charge carriers comprises applying a second bias between the gate oxide and the semiconductor substrate.

33. The method of claim 32, wherein the first and second biases have inverse polarities of each other.

34. A light emitting device comprising:

a gate oxide disposed on a semiconductor substrate;

a floating gate array of nanocrystals embedded in the gate oxide;

a transparent or semi-transparent gate contact formed on the gate oxide; and at least one charge injection source applied light emitting device and programmed such that the nanocrystals are initially injected with at least one first type charge carrier followed by at least one second type charge carrier to form excitons used to produce a light emission.

* * * * *